(12) United States Patent
Hart et al.

(10) Patent No.: US 6,432,808 B1
(45) Date of Patent: Aug. 13, 2002

(54) METHOD OF IMPROVED BONDABILITY WHEN USING FLUORINATED SILICON GLASS

(75) Inventors: Michael J. Hart, Palo Alto; James Karp, Saratoga, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/454,014

(22) Filed: Dec. 3, 1999

(51) Int. Cl.[7] .............................................. H01L 23/49
(52) U.S. Cl. ...................... 438/614; 438/643; 438/653; 438/783; 438/763
(58) Field of Search .............................. 438/612, 783, 438/763, 613, 614, 615, 617, 624, 627, 643, 653, FOR 350, FOR 355

(56) References Cited

U.S. PATENT DOCUMENTS

| | | | |
|---|---|---|---|
| 5,763,010 A | * | 6/1998 | Guo et al. |
| 5,834,365 A | | 11/1998 | Min-Tsung et al. ......... 438/612 |
| 6,008,120 A | * | 12/1999 | Lee |
| 6,010,962 A | * | 1/2000 | Liu et al. |
| 6,174,797 B1 | * | 1/2001 | Bao et al. |
| 6,217,658 B1 | * | 4/2001 | Orczyk et al. |
| 6,261,157 B1 | * | 7/2001 | Bajaj et al. |
| 6,265,779 B1 | * | 7/2001 | Grill et al. |
| 6,287,956 B2 | * | 9/2001 | Yokoyama et al. |

* cited by examiner

Primary Examiner—Wael Fahmy
Assistant Examiner—Joannie Adele Garcia
(74) Attorney, Agent, or Firm—Jeanette S. Harms; Edel M. Young

(57) ABSTRACT

A method of forming a bond pad area for an integrated circuit provides FSG in the dielectric layer while at the same time minimizes bond pad lift off. The method includes forming a first dielectric layer of fluorinated silicon glass (FSG) on a substrate, then forming an FSG barrier layer on the first dielectric layer. A second, non-FSG dielectric layer is formed on the FSG barrier layer. A barrier metal layer is then formed on the second dielectric layer. Finally, a metal layer is formed on the barrier metal layer. This metal layer provides the surface for adhesion to the bonding wire. The FSG barrier layer absorbs the atoms of fluorine diffused from the first dielectric layer. In this manner, fluorine is prevented from penetrating the second dielectric layer, thereby minimizing bond pad lift off between the second dielectric layer and the barrier metal layer. In one embodiment, the FSG barrier layer includes titanium and/or aluminum.

13 Claims, 2 Drawing Sheets

METHOD OF IMPROVED BONDABILITY WHEN USING FLUORINATED SILICON GLASS

BACKGROUND OF THE INVENTION

1. Field of the Invention

The present invention relates to bond pads, and in particular to improving the bondability of bond pads.

2. Discussion of the Related Art

After fabrication, an integrated circuit is typically assembled into a package. The packaged IC is then used on a printed circuit board for use in a system. To provide an electrical connection between the IC and the package, a thin metal wire is bonded to an IC bonding pad and then wired to the appropriate inner lead of the package. This process is repeated for each bonding pad/inner lead.

FIG. 1 shows a prior art bond pad including a substrate 10, a dielectric layer 12, a barrier metal layer 14, and a metal bonding layer 16. Substrate 10 generically represents a semiconductor wafer, devices formed within the wafer, and layers formed on the wafer surface. Dielectric layer 12 includes, for example, phosphosilicate glass (PSG), borophosphosilicate glass (BPSG), or silicon oxide. Barrier metal layer 14 is typically formed from titanium nitride, titanium tungsten (TiW), titanium, or tungsten. After a passivation layer 18 is formed, a window 20 is opened, thereby defining a bond pad area 22.

However, barrier metal layer 14 may not have adequate adhesion to dielectric layer 12. Thus, during bonding of the bond pad to the metal wire (not shown), barrier layer 14 may separate from dielectric layer 12. This bond pad lift off reduces bonding yields and/or reliability.

U.S. Pat. No. 5,834,365 describes a method to minimize bond pad lift off by forming conformal layers underlying the metal bonding layer. For example, referring to FIG. 2, a dielectric layer formed on a substrate 20 is divided into two dielectric layers 22A and 22B. Stripes or other patterns 23, typically comprising polycide, polysilicon, TiW, TiN, or other metals, are formed on first dielectric layer 22A. In this manner, subsequent formed layers, i.e. second dielectric layer 22B and barrier metal layer 24, are conformal to stripes 23. The non-smooth surface of each of these layers was believed to improve adhesion between barrier metal layer 24 and dielectric layers 22A and 22B, thereby preventing bond pad lift off. However, depending on the composition of dielectric layers 22A and 22B, even forming stripes 23 and the subsequent conformal layers cannot eliminate some bond pad lift off.

Specifically, to reduce the dielectric constant, the industry has recently moved from using standard silicon dioxide in the dielectric layer to fluorinated silicon glass (FSG)(silicon dioxide combined with fluorine). The use of FSG lowers the dielectric constant in relative proportion to the concentration of fluorine. For example, a concentration of 5 to 15% fluorine in the dielectric layer reduces the associated dielectric constant by 5–15%. In one case, the addition of fluorine in the dielectric layer lowered the dielectric constant from 4.2 to 3.5. Lowering the dielectric constant in the dielectric layer advantageously reduces the metal to metal capacitance, which in turn improves the speed of the chip. However, the advantage of having a lower dielectric constant has been offset with the disadvantage of more instances of bond pad lift off.

Therefore, a need arises for a method of retaining fluorine in the dielectric layer, while at the same time minimizing bond pad lift off.

SUMMARY OF THE INVENTION

In accordance with the present invention, a method of forming a bond pad area for an integrated circuit retains fluorine in the dielectric layer while at the same time minimizes bond pad lift off. The method includes forming a first dielectric layer comprising fluorinated silicon glass (FSG) layer on a substrate, then forming an FSG barrier layer on the first dielectric layer. A second, non-FSG dielectric layer is formed on the FSG barrier layer. A barrier metal layer is formed on the second dielectric layer. Finally, a metal layer is formed on the barrier metal layer. This metal layer provides the surface for adhesion to the bonding wire.

The first dielectric layer comprising FSG and the FSG barrier layer chemically interact. Specifically, the FSG barrier layer has dangling bonds, which absorb the atoms of fluorine diffused from the FSG layer. Thus, the FSG barrier layer minimizes any outgassing of fluorine into the second dielectric layer adjacent the barrier metal layer. In one embodiment, the FSG barrier layer includes titanium or aluminum. In this manner, the present invention provides a bond pad with a low dielectric constant while at the same time reduces bond pad lift off.

DETAILED DESCRIPTION OF THE DRAWINGS

Figure 1:
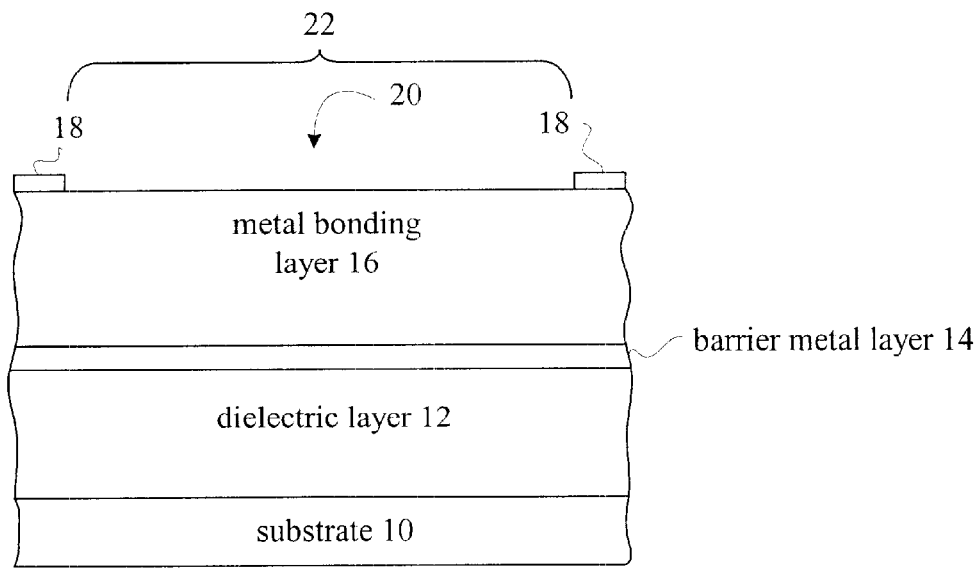
FIG. 1 is a cross-sectional view of a bonding pad in a prior art structure.
Figure 2:
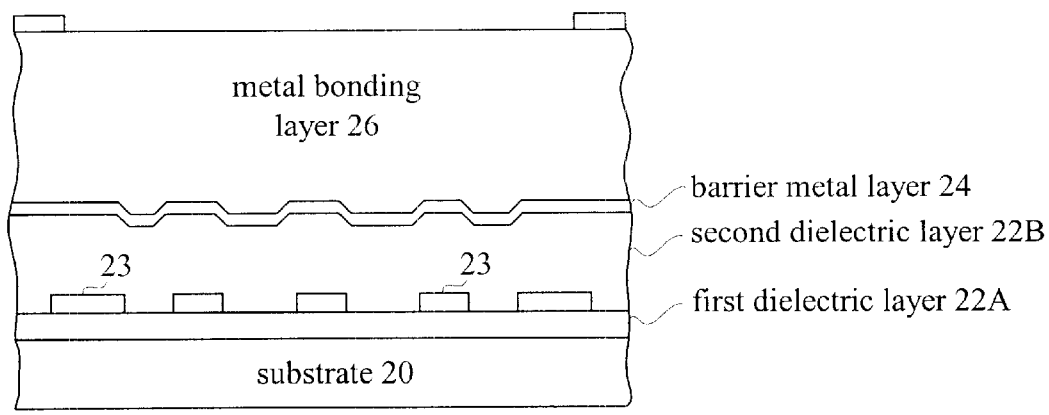
FIG. 2 is a cross-sectional view of a bonding pad in another prior art structure.
Figure 3:
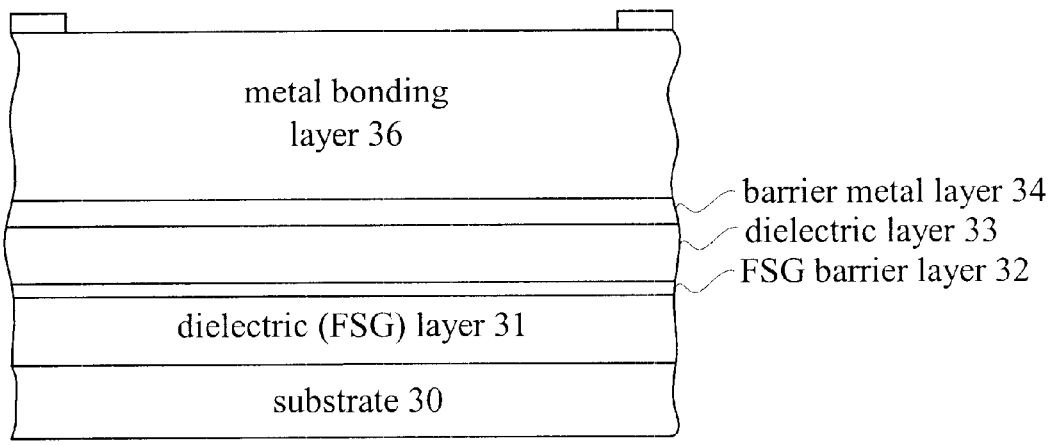
FIG. 3 is a cross-sectional view of a bonding pad in accordance with the present invention.

The present invention solves the problems associated with using fluorinated silicon glass (FSG) for the dielectric layer. Referring to FIG. 3, a substrate 30 generically represents a semiconductor wafer, devices formed within the wafer, and layers formed on the wafer surface. In accordance with the present invention, forming a bond pad on substrate 30 includes forming an FSG barrier layer 32 on a first FSG dielectric layer 31. A second, non-FSG dielectric layer 33 is formed on FSG barrier layer 32. A barrier metal layer 34 is formed on second dielectric layer 33. Finally, a metal bonding layer 36 is formed on barrier metal layer 34. This metal layer provides the surface for adhesion to the bonding wire (not shown).

FSG barrier layer 32 is critical to minimizing bond pad lift off. Specifically, fluorine is a mobile element, which has been found by Applicants to move readily through a dielectric layer. Without the present invention, fluorine would typically reduce the adhesion between dielectric layer 33 and barrier metal layer 34, thereby resulting in bond pad lift off. However, in the present invention, first FSG dielectric layer 31 and FSG barrier layer 32 chemically interact. Specifically, FSG barrier layer 32 absorbs the atoms of fluorine diffused from first dielectric (FSG) layer 31, thereby preventing the fluorine from outgassing into second dielectric layer 33. In this manner, the present invention ensures a low dielectric constant as well as minimal bond pad lift off.

In one embodiment, first FSG dielectric layer 31 is between approximately 0.3 to 1.0 microns thick and is formed from silicon dioxide with a 5% to 15% concentration of fluorine. FSG barrier layer 32 is between 100 angstroms and 1000 angstroms thick, and is formed from, for example, titanium, aluminum, or a combination of these metals. Second dielectric layer 33 is approximately 1000 angstroms thick, and is formed from any non-FSG dielectric, such as tetraethoxysiliane (TEOS) or standard silicon dioxide. Note that standard deposition and etching techniques are used in the present invention to form the bond pad area and thus are not described in detail herein. In one embodiment, the area of the bond pad is approximately 3000 to 4200 square microns.

While the present invention has been shown and described with reference to the embodiment of FIG. 3, those skilled in the art will recognize that modifications may be made to that embodiment without departing from the spirit and scope of the invention.

What is claimed is:

1. A method of forming a bond pad area for an integrated circuit, the method comprising:

forming a first dielectric layer on a substrate, wherein the first dielectric layer includes fluorinated silicon glass (FSG);

forming an FSG barrier layer on the first dielectric layer, the FSG barrier layer comprising a metal from the group consisting of titanium and aluminum;

forming a second dielectric layer on the FSG barrier layer, wherein the second dielectric layer is a non-FSG dielectric;

forming a barrier metal layer on the second dielectric layer; and forming a metal layer on the barrier metal layer.

2. The method of claim 1, wherein the FSG barrier layer includes dangling bonds that absorb diffused fluorine of the first dielectric layer.

3. A bond pad for an integrated circuit, the bond pad comprising:

a substrate;

a first dielectric layer formed on the substrate, wherein the first dielectric layer includes fluorinated silicon glass (FSG);

an FSG barrier layer formed on the first dielectric layer, the FSG barrier layer comprising a metal from the group consisting of titanium and aluminum;

a second dielectric layer formed on the FSG barrier layer, wherein the second dielectric layer is a non-FSG dielectric;

a barrier metal layer formed on the second dielectric layer; and a metal layer formed on the barrier metal layer.

4. The bond pad of claim 3, wherein the FSG barrier layer includes titanium.

5. The bond pad of claim 3, wherein the FSG barrier layer includes aluminum.

6. The bond pad of claim 3, wherein the FSG barrier layer has dangling bonds which absorb fluorine.

7. The bond pad of claim 3, wherein the FSG barrier layer is between approximately 100 angstroms and 1000 angstroms thick.

8. The bond pad of claim 3, wherein the first dielectric layer is between approximately 0.3 to 1.0 microns thick.

9. The bond pad of claim 3, wherein the first dielectric layer is formed from a 5% to 15% concentration of fluorine.

10. The bond pad of claim 3, wherein the second dielectric layer is approximately 1000 angstroms thick.

11. The bond pad of claim 3, wherein the second dielectric layer is formed from any non-FSG dielectric.

12. The bond pad of claim 3, wherein the second dielectric layer is formed from tetraethoxysiliane (TEOS).

13. The bond pad of claim 3, wherein the second dielectric layer is formed from silicon dioxide.

* * * * *